(12) United States Patent
Youn et al.

(10) Patent No.: US 9,087,747 B2
(45) Date of Patent: Jul. 21, 2015

(54) DISPLAY DEVICE AND METHOD OF MANUFACTURING THE SAME

(75) Inventors: Joo-Ae Youn, Seongnam-si (KR); Chong-Chul Chai, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 831 days.

(21) Appl. No.: 12/277,654

(22) Filed: Nov. 25, 2008

(65) Prior Publication Data
US 2009/0200554 A1    Aug. 13, 2009

(30) Foreign Application Priority Data
Feb. 12, 2008    (KR) .................. 10-2008-0012692

(51) Int. Cl.
*H01L 29/04* (2006.01)
*H01L 27/12* (2006.01)
*H01L 29/417* (2006.01)

(52) U.S. Cl.
CPC .......... *H01L 27/124* (2013.01); *H01L 27/1255* (2013.01); *H01L 29/41733* (2013.01)

(58) Field of Classification Search
CPC ............... H01L 27/12; H01L 27/1214; H01L 29/41733
USPC ......... 257/59, 72, E27.131, E27.132; 349/42, 349/43
See application file for complete search history.

(56) References Cited

U.S. PATENT DOCUMENTS

| 6,987,548 B2 | 1/2006 | Lim | |
|---|---|---|---|
| 2003/0038901 A1* | 2/2003 | Baek et al. | 349/43 |
| 2003/0168661 A1* | 9/2003 | Yamazaki et al. | 257/72 |
| 2005/0104814 A1* | 5/2005 | Choi et al. | 345/76 |
| 2006/0128054 A1* | 6/2006 | Kim et al. | 438/82 |
| 2008/0246037 A1* | 10/2008 | Kang et al. | 257/72 |

FOREIGN PATENT DOCUMENTS

| JP | 2000-243975 | 9/2000 |
|---|---|---|
| JP | 2001250953 | 9/2001 |
| JP | 2007266236 | 10/2007 |
| KR | 10-2001-0083416 | 9/2001 |
| KR | 1020030008787 | 1/2003 |
| KR | 1020030062592 | 7/2003 |
| KR | 10-2003-0069668 | 8/2003 |
| KR | 1020070026046 | 3/2007 |
| KR | 1020070040523 | 4/2007 |
| KR | 1020070051570 | 5/2007 |
| KR | 1020070052979 | 5/2007 |
| KR | 1020070071259 | 7/2007 |
| KR | 1020070071491 | 7/2007 |
| KR | 1020070082346 | 8/2007 |
| KR | 10-2008-0062317 | 7/2008 |

* cited by examiner

*Primary Examiner* — Vongsavanh Sengdara
(74) *Attorney, Agent, or Firm* — H.C. Park & Associates, PLC

(57) ABSTRACT

The display device includes a substrate, a thin film transistor (TFT), which includes a gate electrode, a semiconductor layer, and source and drain electrodes, on the substrate member, a passivation layer on the TFT and having an opening to expose a portion of the drain electrode, and a pixel electrode directly on the drain electrode and only within the opening.

14 Claims, 11 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2008-0012692, filed on Feb. 12, 2008, which is hereby incorporated herein by reference for all purposes as if fully set forth herein.

BACKGROUND OF THE INVENTION

1. Field of the Invention

The present invention relates to a display device and a method of manufacturing the same and, more particularly, to a display device and a simplified process of manufacturing the same that may minimize the occurrence of defects.

2. Discussion of the Background

There are various types of display devices. Among them, liquid crystal displays (LCDs) and organic light emitting displays (OLED), which have been improved in their performance and are small and light in line with the rapid development of semiconductor techniques, are typical display devices.

In general, display devices may be manufactured through a thin film formation process in which a plurality of conductive layers and insulating layers are sequentially patterned and stacked. The thin film formation process may include a photoetching process using a mask.

The number of photoetching processes using masks that are required to manufacture a display device is directly correlated with the productivity of the manufacturing method. Namely, the fewer photoetching processes, the greater the productivity of the manufacturing process.

Thus, it is desirable to minimize the number of photoetching processes using masks.

Recently, a method in which a passivation layer, which covers thin film transistors, and pixel electrodes, which are generally formed on the passivation layer, are formed using a single mask has been developed.

However, in a display device manufactured by such a method, disconnections may occur easily at the pixel electrodes. Suppressing the occurrence of such disconnections may complicate the processes and make it difficult to form pixel electrodes with uniform quality.

SUMMARY OF THE INVENTION

The present invention provides a display device that may have a simplified manufacturing process and minimal defects.

The present invention also provides a method of manufacturing the device.

Additional features of the invention will be set forth in the description which follows, and in part will be apparent from the description, or may be learned by practice of the invention.

The present invention discloses a display device including a substrate, a thin film transistor (TFT), which includes a gate electrode, a semiconductor layer, and source and drain electrodes, on the substrate, a passivation layer, which includes an opening to expose a portion of the drain electrode, on the TFT, and a pixel electrode directly on the drain electrode and only within the opening.

The present invention also discloses a display device including a substrate, gate wirings, which include a gate line and a gate electrode on the substrate, a gate insulating layer covering the gate wirings, a semiconductor layer on the gate insulating layer, data wirings on the semiconductor layer, and a pixel electrode. The data wirings include source and drain electrodes, each of which has at least one portion overlapping the gate electrode and is separately formed, and a data line connected with the source electrode. The pixel electrode is on the drain electrode, and the drain electrode has an area larger than the pixel electrode.

The present invention also discloses a method of manufacturing a display device including forming gate wirings including a gate line and a gate electrode on a substrate, forming a gate insulating layer covering the gate wirings, forming a semiconductor layer on the gate insulating layer such that at least a portion of the semiconductor layer overlaps with the gate electrode, forming data wirings including source and drain electrodes, which each have at least one portion overlapping with the gate electrode and are spaced from each other, and a data line on the semiconductor layer, forming a passivation layer on the data wirings, forming a photosensitive polymer pattern on the passivation layer through a photolithography process using a mask, etching the passivation layer using the photosensitive polymer pattern to form an opening exposing a portion of the drain electrode, forming a conductive layer on the exposed portion of the drain electrode and on the photosensitive polymer pattern, and removing the photosensitive polymer pattern and the conductive layer on the photosensitive polymer pattern to form a pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
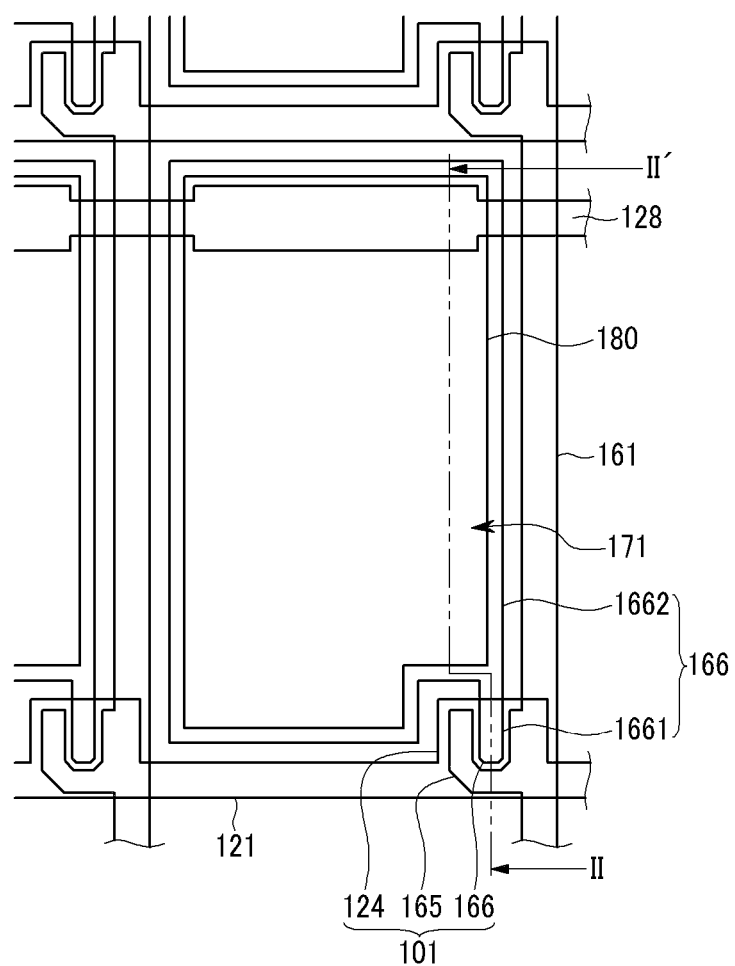
FIG. 1 is a layout view of a display device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
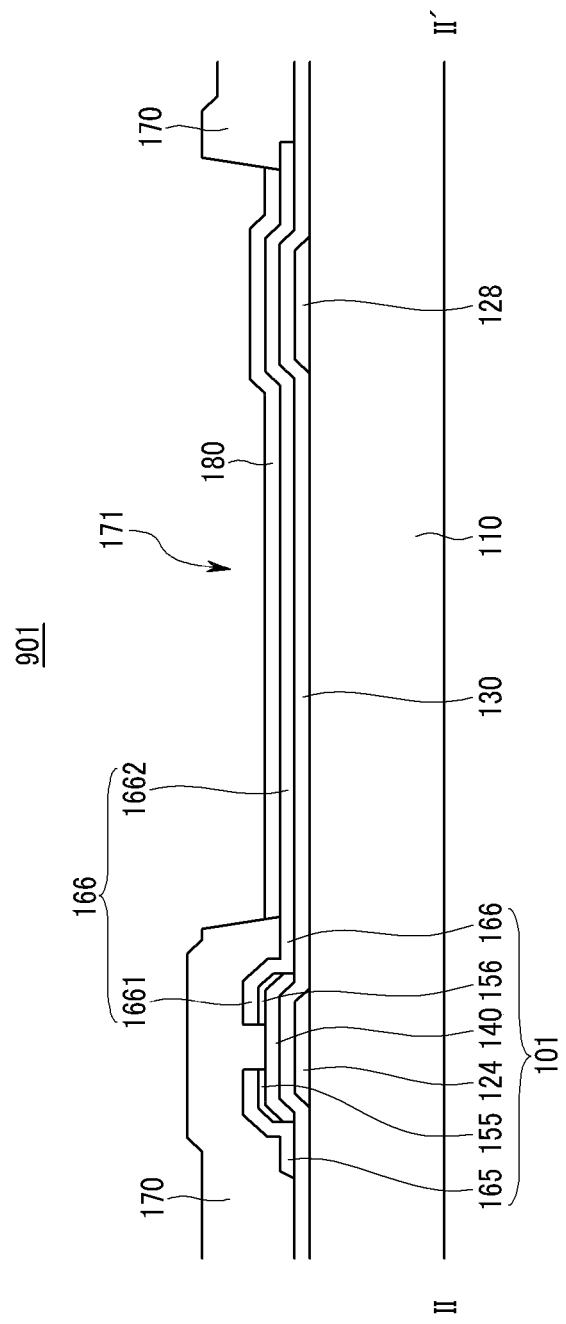
FIG. 2 is a cross-sectional view taken along line II-II' in FIG. 1.

A display device 901 according to a first exemplary embodiment of the present invention will now be described with reference to FIG. 1 and FIG. 2. FIG. 1 is a layout view of a display device according to a first exemplary embodiment of the present invention, and FIG. 2 is a cross-sectional view taken along line II-II' in FIG. 1.

The display device 901 is a reflective display device that displays images by reflecting external light. The display device 901 includes a substrate 110, a thin film transistor (TFT) 101, a passivation layer 170, and a pixel electrode 180.

The TFT 101 includes a gate electrode 124, a semiconductor layer 140, a source electrode 165, and a drain electrode 166. The drain electrode 166 has an area larger than that of the pixel electrode 180. The drain electrode 166 includes an electrode part 1661 facing the source electrode 165 and a pixel part 1662 extending from the electrode part 1661 and disposed under the pixel electrode 180.

The passivation layer 170 covers the TFT 101 and has an opening 171 exposing a portion of the drain electrode 166.

The pixel electrode 180 is disposed on the drain electrode 166 and only in the opening 171 of the passivation layer 170. Thus, the entire pixel electrode 180 overlaps with the pixel part 1662 of the drain electrode 166.

The pixel electrode 180 may be made of a reflective material having relatively good reflexibility, such as aluminum (Al), silver (Ag), or gold (Au). Because the display device 901 is a reflective display device, the use efficiency of light may be increased if the pixel electrode 180 has high reflexibility. However, the present invention is not limited thereto. Thus, the pixel electrode 180 may be made of various other conductive materials.

The display device 901 further includes a storage electrode line 128, which may be on the same layer as the gate electrode 124 and made of the same material as the gate electrode 124. The pixel electrode 180 forms a capacitor by overlapping with the storage electrode line 128 together with the drain electrode 166.

In addition, although not shown, the display device 901 may further include a connection member and a connecting member, which may be formed together and may be made of the same material as the pixel electrode 180. The connecting member connects separated wirings according to a bridge method, and the connection member is connected with components, such as a flexible printed circuit film or a driving integrated circuit (IC) chip.

The structure of the display device 901 will now be described in detail based on the stacking order with reference to FIG. 2.

The substrate 110 may be formed of various insulating substrates, which may be made of glass, quartz, ceramic, or plastic. Also, an insulation-processed metal plate may be used as the substrate 110. Here, the substrate 110 does not need to be transparent. Namely, the substrate 110 may be opaque.

Gate wirings, which include a gate line 121 (see FIG. 1), the gate electrode 124, and the storage electrode line 128, are disposed on the substrate 110. The gate wirings may be made of metals, such as Al, Ag, Cr, Ti, Ta, Mo, or their alloys. In FIG. 2, the gate wirings are shown as a single layer, but the gate wirings may have multiple layers including a metal layer of Cr, Mo, Ti, Ta, or their alloys having good physical and chemical characteristics and an Al-based or Ag-based metal layer having low resistivity. Alternatively, the gate wirings may be made of various other metals or conductors and may include multiple layers that can be patterned under the same etching conditions.

A gate insulating layer 130, which may be made of silicon nitride ($SiN_x$), is disposed on the gate wirings.

Data wirings, which include a data line 161 (in FIG. 1) insulated from the gate line 121 and crossing the gate line 121, a source electrode 165 having at least one region overlapping with the gate electrode 124, and a drain electrode 166 spaced apart from the source electrode 165 and having at least one region overlapping with the gate electrode 124, are disposed on the gate insulating layer 130. The drain electrode 166 includes the electrode part 1661 facing the source electrode 165 and the pixel part 1662 extending from the electrode part 1661 and disposed under the pixel electrode 180.

Like the gate wirings, the data wirings may also be made of a conductive material such as chromium, molybdenum, aluminum, or their alloy, and may include a single layer or multiple layers.

The semiconductor layer 140 is disposed on a portion of the gate insulating layer 130 and under the source electrode 165 and the drain electrode 166. Here, the gate electrode 124, the source electrode 165, and the drain electrode 166 are three electrodes of the TFT 101. The semiconductor layer 140 between the source electrode 165 and the drain electrode 166 serves as a channel region of the TFT 101. Here, the TFT 101 is not limited to the structure shown in the accompanying drawings and may have various other structures.

Ohmic contact layers 155 and 156 are disposed between the semiconductor layer 140 and the source and drain electrodes 165 and 166 in order to reduce contact resistance therebetween. The ohmic contact layers 155 and 156 may be made of silicide or amorphous silicon in which n-type impurities are doped with high density.

The passivation layer 170, which may be made of an inorganic insulating material, such as silicon nitride or silicon oxide, or an insulating material with a small dielectric constant (low-k), such as a-Si:C:O, a-Si:O:F, formed through plasma enhanced chemical vapor deposition (PECVD), is disposed on the data wirings. The passivation layer 170 includes the opening 171 exposing a portion of the drain electrode 166.

The pixel electrode 180 is disposed on the drain electrode 166 in the opening 171 of the passivation layer 170. Here, the drain electrode 166 exposed via the opening 171 of the passivation layer 170 may be covered by the pixel electrode 180 in the manufacturing process. Namely, the area of the opening 171 of the passivation layer 170 is substantially equivalent to that of the pixel electrode 180.

The pixel electrode 180, which may be made of a metal film, such as aluminum (Al), silver (Ag), or gold (Au), with a relatively good reflexibility or a transparent conductor, such as Indium Tin Oxide (ITO) or Indium Zinc Oxide (IZO). In order to increase the use efficiency of light, the pixel electrode 180 may be made of a material with good reflexibility.

The pixel electrode 180 overlaps with the storage electrode line 128 together with the drain electrode 166, to form a capacitor.

Although not shown, the display device 901 may further include a liquid crystal layer, common electrodes, and color filters, an organic light emitting diode, or an electrophoretic display unit.

The display device 901 may be manufactured through a simple manufacturing process, improving productivity and minimizing the occurrence of defects.

Namely, because the pixel electrode 180 does not overlap a step of an edge of the drain electrode 166, the pixel electrode 180 may not have a defect, such as disconnections at the bent portion, generated by the step of the lower layer.

Although, the pixel electrode 180 may overlap the gate wirings and the storage electrode line 128, because several layers exist between the pixel electrode 180 and the gate wirings, the pixel electrode 180 may not have a substantial defect, such as disconnections.

The passivation layer 170 having the opening 171 and the pixel electrode 180 may be formed through a photoetching process using a single mask, so the display device 901 may be manufactured through a simple manufacturing process.

The manufacturing process of the display device 901 according to the first exemplary embodiment of the present invention will now be described with reference to FIG. 3, FIG. 4, FIG. 5, and FIG. 6.

FIG. 3, FIG. 4, FIG. 5, and FIG. 6 are cross-sectional views sequentially showing a method of manufacturing the display device according to the first exemplary embodiment of the present invention.

Figure 3:
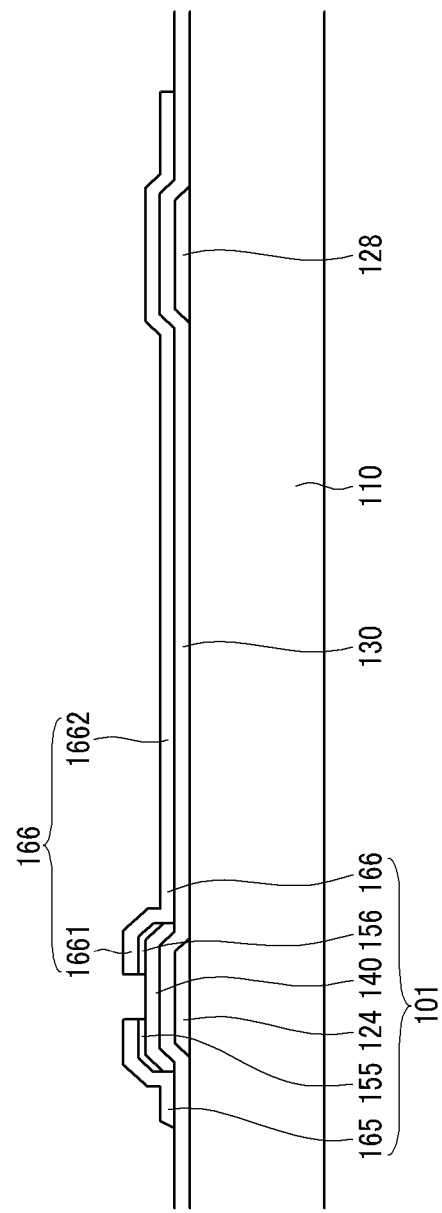
FIG. 3, FIG. 4, FIG. 5, and FIG. 6 are cross-sectional views sequentially showing a method of manufacturing the display device according to the first exemplary embodiment of the present invention.

First, as shown in FIG. 3, the TFT 101, which includes the gate electrode 124, the semiconductor layer 140, the source electrode 165, and the drain electrode 166, is formed on the first substrate member 110. Here, the TFT 101 is not limited to having the structure shown in the accompanying drawings and may have various other known structures.

Thus far, a photoetching process using a mask has been performed three times. The photoetching process includes a photolithography process using a mask and an etching process using a photosensitive polymer pattern formed through the photolithography process. Namely, the photoetching process refers to a process of forming the photosensitive polymer pattern through the photolithography process and patterning the thin film through the etching process using the photosensitive polymer pattern. Here, the photolithography process includes an exposing and developing process, and the thin film includes all of a conductive layer, an insulating layer, an inorganic film, and an organic film.

In detail, the photoetching process using a first mask is performed when forming the gate wirings, which include the gate electrode 124 and the storage electrode line 128. The photoetching process using a second mask is performed when patterning the semiconductor layer 140. The photoetching process using a third mask is performed when forming the data wirings, which include the source electrode 165 and the drain electrode 166.

Figure 4:
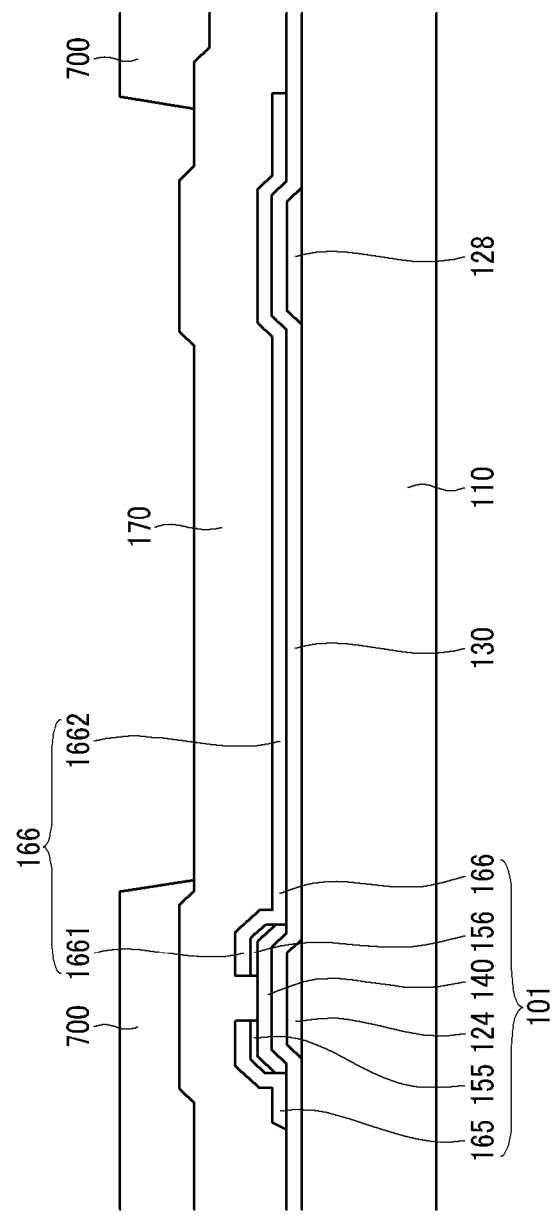

Next, as shown in FIG. 4, the passivation film 170 is formed to cover the TFT 101, and the photosensitive polymer pattern 700 is formed on the passivation layer 170 through a photolithography process using a fourth mask.

Figure 5:
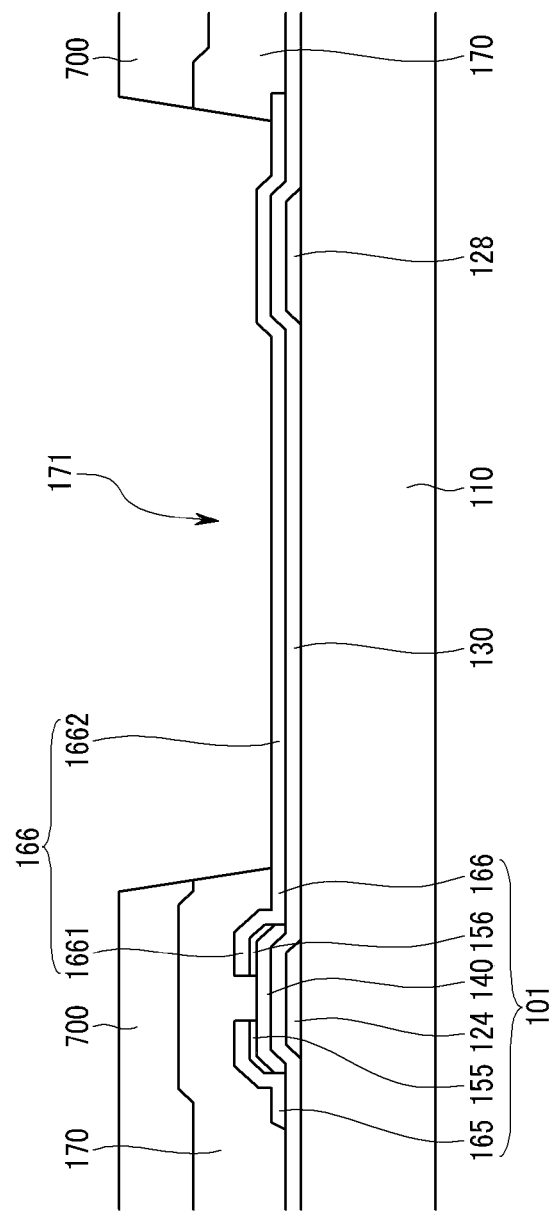

Thereafter, as shown in FIG. 5, the opening 171 is formed to expose a portion of the drain electrode 166 of the TFT 101 using the photosensitive polymer pattern 700.

Figure 6:
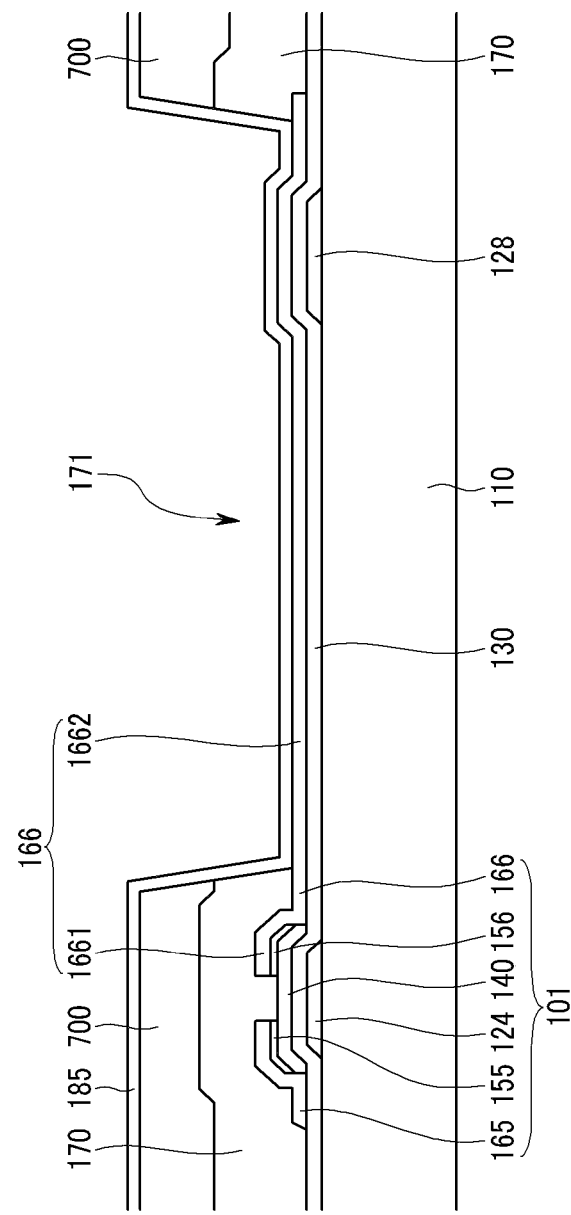

Then, as shown in FIG. 6, a conductive layer 185 is formed on the portion of the drain electrode 166 exposed via the opening 171 and on the photosensitive polymer pattern 700.

The conductive layer 185 may be made of a metal film, such as aluminum (A), silver (Ag), or gold (Au), having good light reflexibility, or may be made of a transparent conductor, such as ITO or IZO.

Thereafter, the photosensitive polymer pattern 700 and the conductive layer 185 formed on the photosensitive polymer pattern 700 are removed to form the pixel electrode 180, as shown in FIG. 2. Namely, the conductive layer 185, which has not been removed together with the photosensitive polymer pattern 700, becomes the pixel electrode 180.

The pixel electrode 180 is formed on the drain electrode 166 only in the opening 171 of the passivation layer 170. The drain electrode 166 is formed to be larger than the pixel electrode 180 and includes the electrode part 1661 facing the source electrode 165 and the pixel part 1662 disposed under the pixel electrode 180. The entire pixel electrode 180 overlaps with the pixel part 1662 of the drain electrode 166. Namely, the drain electrode 166 exposed via the opening 171 of the passivation layer 170 is covered by the pixel electrode 180.

In addition, the storage electrode line 128, which may made of the same material as the gate electrode 124, is formed on the same layer on which the gate electrode 124 is formed. The pixel electrode 180 forms a capacitor by overlapping with the storage electrode line 128 together with the drain electrode 166.

Thus, because the passivation layer 170 having the opening 171 and the pixel electrode 180 are formed through a photoetching process using a single mask, the manufacturing process may be simplified. At this time, the display device 901 is formed through a total of four photoetching processes.

In addition, the pixel electrode 180 does not to overlap with the data wirings, in particular, with the step of the edge of the drain electrode 166. Accordingly, the pixel electrode 180 may be stably formed without a bent portion caused by the drain electrode 166. Namely, the pixel electrode 180 may be prevented from having a defect, such as disconnections, that may be caused by a protrusion of the lower layer.

Figure 7:
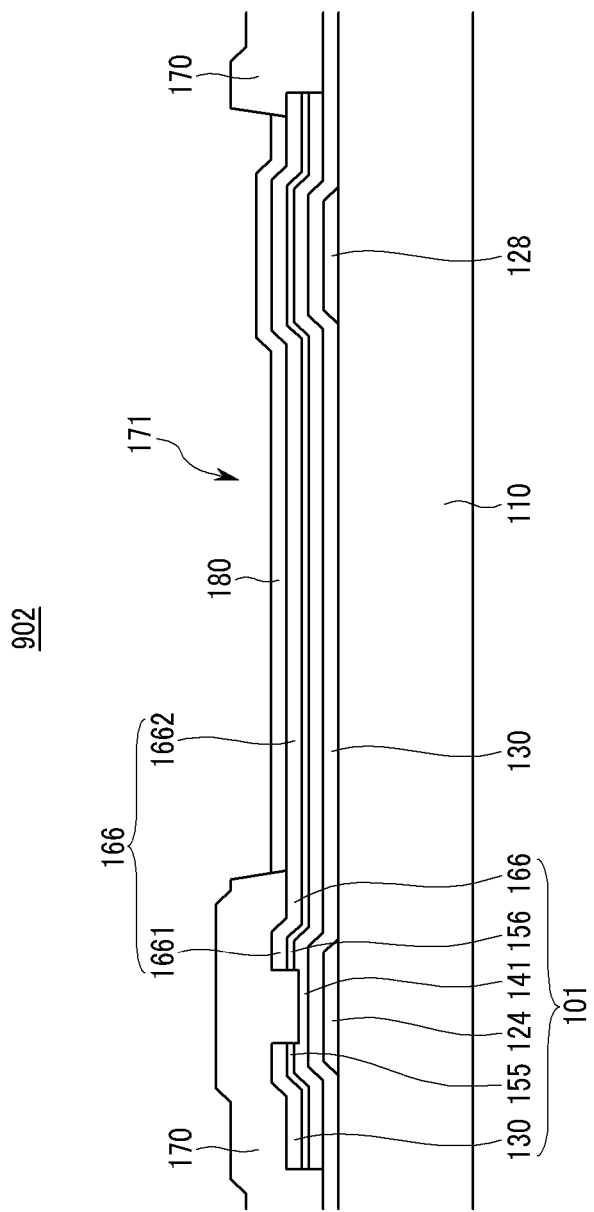
FIG. 7 is a cross-sectional view of a display device according to a second exemplary embodiment of the present invention.

FIG. 7 is a cross-sectional view of a display device 902 according to a second exemplary embodiment of the present invention.

The display device 902 according to the second exemplary embodiment of the present invention will now be described with reference to FIG. 7.

As shown in FIG. 7, the display device 902 according to the second exemplary embodiment of the present invention includes a gate electrode 124, a storage electrode line 128, a gate insulating layer 130 formed on the substrate 110, a semiconductor layer 141, a source electrode 165, a drain electrode having an area larger than the pixel electrode 180, ohmic contact layers 155 and 156 positioned between the source and drain electrodes 155 and 156 and the semiconductor layer 141, and a passivation layer 170 having the opening 171. This structure is substantially the same as that in the first exemplary embodiment, as shown in FIG. 2.

According to the second exemplary embodiment of the present invention, the semiconductor layer 141, the ohmic contact layers 155 and 156, and the data wirings 161, 165, and 166 may have the same pattern at portions except for in a channel region of the TFT 101.

The display device 902 may be manufactured through a simpler manufacturing process, so the productivity may be improved and the occurrence of defects (defective proportion) can be minimized.

The semiconductor layer 141, the ohmic contact layers 155 and 156, and the data wirings 161, 165, and 166 may be formed together through a photoetching process using a single mask, so the display device 902 may be manufactured through a simplified manufacturing process.

The manufacturing process of the display device 902 according to the second exemplary embodiment of the present invention will now be described with reference to FIG. 8, FIG. 9, FIG. 10, and FIG. 11.

FIG. 8, FIG. 9, FIG. 10, and FIG. 11 are cross-sectional views sequentially showing a method of manufacturing the display device according to the second exemplary embodiment of the present invention.

Figure 8:
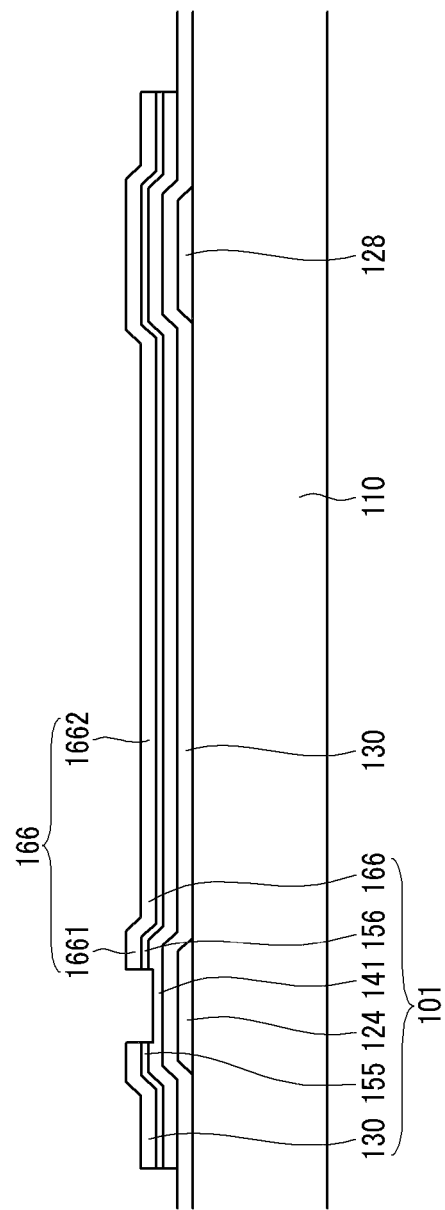
FIG. 8, FIG. 9, FIG. 10, and FIG. 11 are cross-sectional views sequentially showing a method of manufacturing the display device according to the second exemplary embodiment of the present invention.

First, as shown in FIG. 8, gate wirings, which include the gate electrode 124 and the storage electrode line 128, the gate insulating layer 130 to cover the gate wirings, the semiconductor layer 141 having at least a portion overlapping with the gate electrode 124 on the gate insulating layer 130, and the data wirings including the source and drain electrodes 165 and 166, which each have at least a portion overlapping with the gate electrode 124 and are spaced apart from each other, and the data line (see FIG. 1) connected with the drain electrode 166 and the source electrode 165 on the semiconductor layer 141 are formed on the first substrate 110. Here, the gate electrode 124, the source electrode 165, and the drain electrode 166 are three electrodes of the TFT 101. The semiconductor layer 141 between the source electrode 165 and the drain electrode 166 serves as a channel region of the TFT 101.

Thus far, the photoetching process using masks has been performed twice. In detail, the photoetching process using a first mask is performed in the process of forming the gate wirings including the gate electrode 124 and the storage electrode line 128. The photoetching process using a second mask is performed in the process of patterning the semiconductor layer 141, the ohmic contact layers 155 and 156, and the data wirings 161, 165, and 166. In order to form the channel region of the TFT 101, the second mask may have a slit pattern. Namely, a photosensitive polymer pattern layer having portions with different thicknesses is formed through partial exposure using the mask with the slit pattern, the semiconductor layer 141, the ohmic contact layers 155 and 156, and the data wirings 161, 165, and 166 are patterned through an etching process using the photosensitive polymer pattern layer, and then, the channel region of the TFT 101 is formed. The semiconductor layer 141, the ohmic contact layers 155 and 156, and the data wirings 161, 165, and 166, except for the channel region of the TFT 101, may have the same pattern.

Figure 9:
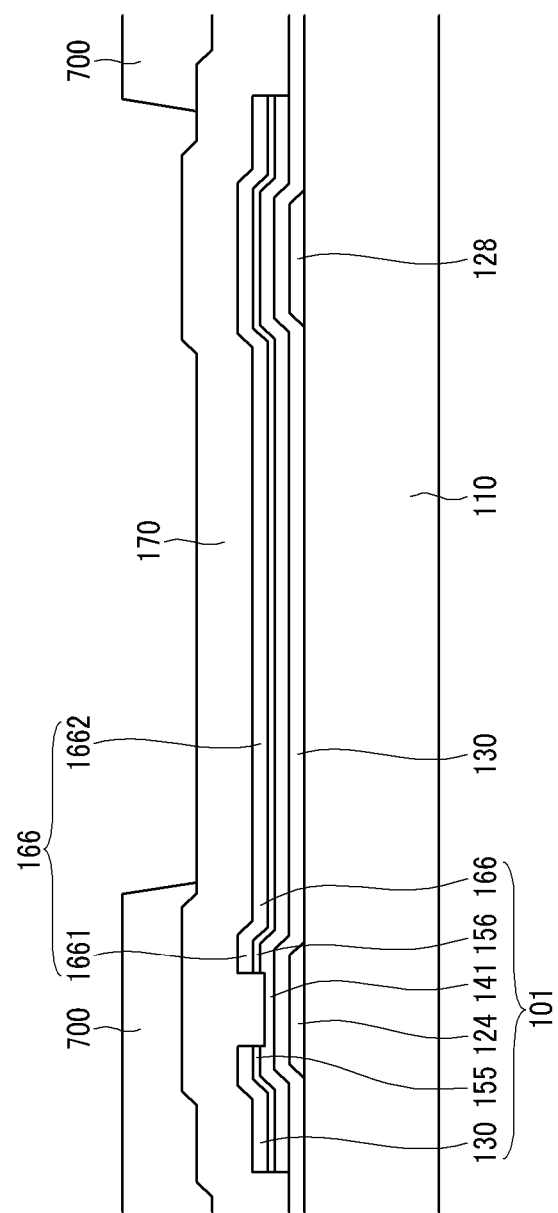

Next, as shown in FIG. 9, the passivation layer 170 is formed to cover the TFT 101, and the photosensitive polymer pattern 700 is formed on the passivation layer 170 through a photolithography process using a third mask.

Figure 10:
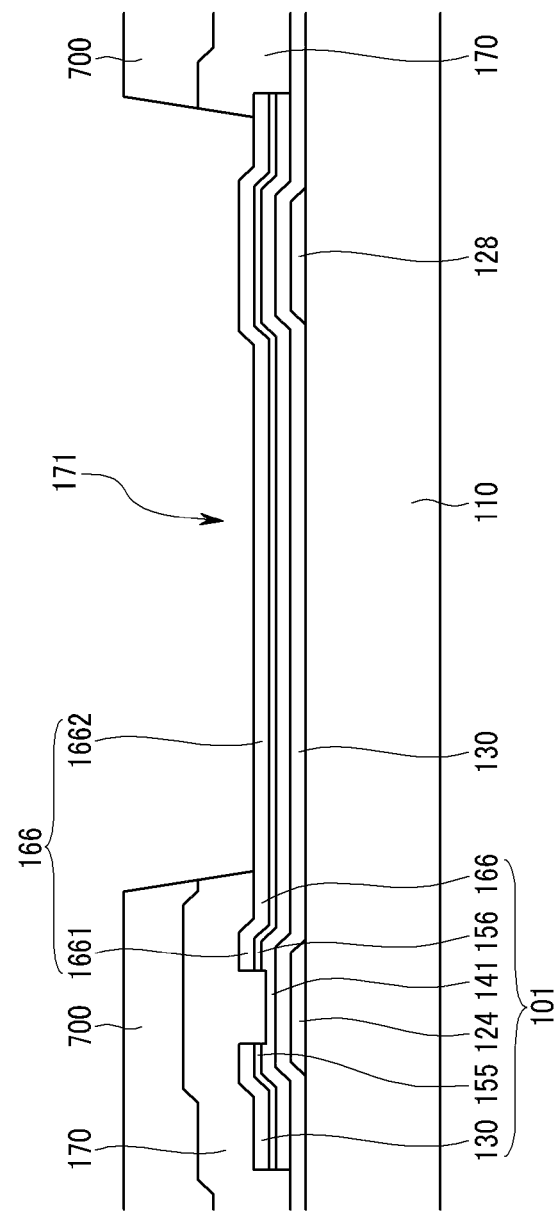

Subsequently, as shown in FIG. 10, the opening 171 exposing a portion of the drain electrode 166 of the TFT 101 is formed using the photosensitive polymer pattern 700.

Figure 11:
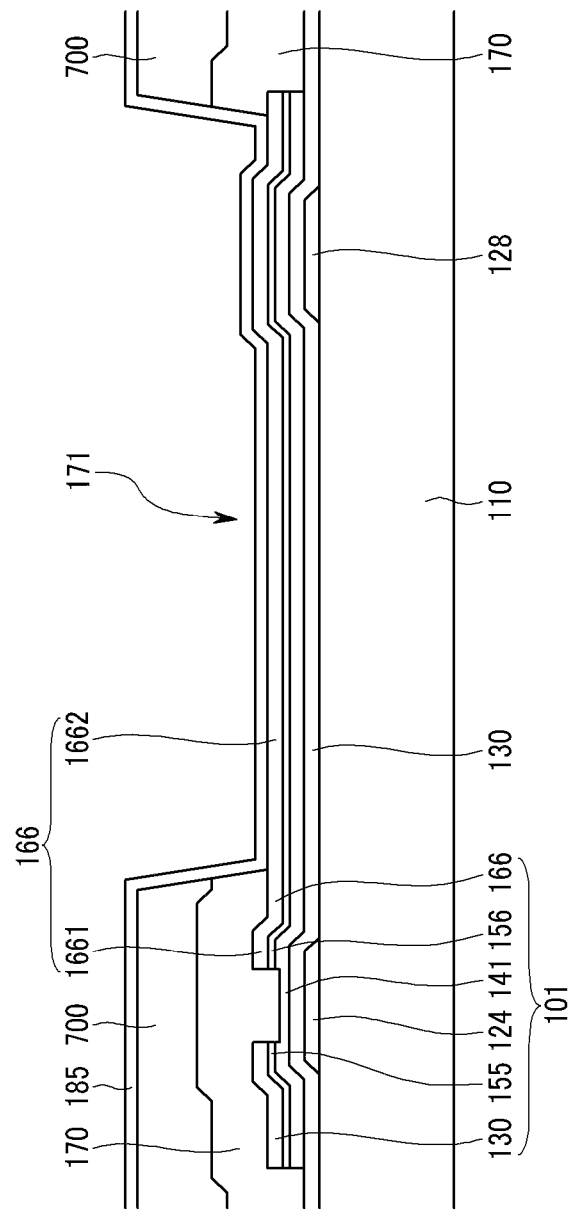

Thereafter, as shown in FIG. 11, the conductive layer 185 is formed on the drain electrode 166 exposed via the opening 171 and on the photosensitive polymer pattern 700.

The conductive layer 185 may be made of a metal film such as aluminum (A), silver (Ag), or gold (Au), having good light reflexibility, or may be made of a transparent conductor, such as ITO or IZO.

Thereafter, the photosensitive polymer pattern 700 and the conductive layer 185 formed on the photosensitive polymer pattern 700 are removed to form the pixel electrode 180, as shown in FIG. 7. Namely, the conductive layer 185 that has not been removed together with the photosensitive polymer pattern 700 becomes the pixel electrode 180.

The pixel electrode 180 is formed directly on the drain electrode 166 only in the opening 171 of the passivation layer 170. The drain electrode 166 is larger than the pixel electrode 180 and includes the electrode part 1661 facing the source electrode 165 and the pixel part 1662 disposed under the pixel electrode 180. Substantially the entire pixel electrode 180 overlaps with the pixel part 1662 of the drain electrode 166. The portion of the drain electrode 166 that is exposed via the opening 171 of the passivation layer 170 is substantially covered by the pixel electrode 180.

In addition, the storage electrode line 128, which may be made of the same material as the gate electrode 124, is formed on the same layer as the gate electrode 124. The pixel electrode 180 forms a capacitor by overlapping with the storage electrode line 128 together with the drain electrode 166.

Thus, because the passivation layer 170 having the opening 171 and the pixel electrode 180 are formed through a photoetching process using a single mask, the manufacturing process may be simplified. In this case, the display device 902 is formed through a total of three photoetching processes, and so the manufacturing process may be further simplified.

In addition, the pixel electrode 180 does not overlap with the data wirings, in particular, with a step of an edge of the drain electrode 166. Accordingly, the pixel electrode 180 may be stably formed without a bent portion caused by the drain electrode 166. Namely, the pixel electrode 180 may be prevented from having a defect, such as disconnections, that may be caused by a protrusion of the lower layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
a substrate;
a thin film transistor (TFT) disposed on the substrate and comprising a gate electrode, a semiconductor layer, a source electrode, and a drain electrode;
a passivation layer disposed on the TFT and comprising an opening to expose a portion of the drain electrode; and
a pixel electrode directly on the drain electrode and only within the opening,
wherein the drain electrode covers a larger portion of the substrate than the pixel electrode.

2. The device of claim 1, wherein the drain electrode comprises an electrode part facing the source electrode and a pixel part extending from the electrode part and disposed below the pixel electrode.

3. The device of claim 2, wherein the pixel electrode entirely overlaps the pixel part of the drain electrode.

4. The device of claim 3, wherein the pixel electrode comprises one or more of aluminum (Al), silver (Ag), and gold (Au).

5. The device of claim 1, further comprising a storage electrode line disposed on the same layer as the gate electrode, the storage electrode line overlapping the pixel electrode and the drain electrode to form a capacitor.

6. The device of claim 1, wherein the device is a reflective display device that displays an image when the pixel electrode reflects external light.

7. The device of claim 1, wherein a perimeter of a top surface of the pixel electrode is contained entirely within a perimeter of a top surface of the drain electrode in a plan view.

8. The device of claim 1, wherein all opposing surfaces of the pixel electrode and the drain electrode directly contact one another.

9. A display device, comprising:
a substrate;
gate wirings disposed on the substrate and comprising a gate line and a gate electrode;
a gate insulating layer covering the gate wirings;

a semiconductor layer disposed on the gate insulating layer;

data wirings disposed on the semiconductor layer, the data wirings comprising a source electrode and a drain electrode, which each comprise at least one portion overlapping with the gate electrode and are separately formed, and a data line connected with the source electrode; and a pixel electrode disposed on the drain electrode; and a storage electrode line disposed on the same layer as the gate electrode, the storage electrode line overlapping with the pixel electrode and the drain electrode to form a capacitor, wherein the area of an entire top surface of the drain electrode is larger than the area of an entire top surface of the pixel electrode.

10. The device of claim 9, further comprising a passivation layer disposed on the data wirings and comprising an opening to expose a portion of the drain electrode.

11. The device of claim 10, wherein the pixel electrode is disposed on the exposed portion of the drain electrode.

12. The device of claim 9, wherein the semiconductor layer is positioned between the storage electrode line and the drain electrode.

13. The device of claim 9, wherein a perimeter of the top surface of the pixel electrode is contained entirely within a perimeter of the top surface of the drain electrode in a plan view.

14. The device of claim 9, wherein a lowermost surface of the pixel electrode is directly formed on only the drain electrode.

\* \* \* \* \*